United States Patent
Nakada et al.

(10) Patent No.: US 10,508,336 B2
(45) Date of Patent: Dec. 17, 2019

(54) SUBSTRATE PROCESSING APPARATUS

(71) Applicant: HITACHI KOKUSAI ELECTRIC INC., Tokyo (JP)

(72) Inventors: Takayuki Nakada, Toyama (JP); Takashi Nogami, Toyama (JP); Tomoshi Taniyama, Toyama (JP); Daigi Kamimura, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 261 days.

(21) Appl. No.: 15/632,678

(22) Filed: Jun. 26, 2017

(65) Prior Publication Data
US 2017/0292188 A1 Oct. 12, 2017

Related U.S. Application Data

(63) Continuation of application No. PCT/JP2016/051530, filed on Jan. 20, 2016.

(30) Foreign Application Priority Data

Jan. 21, 2015 (JP) .................................. 2015-009394

(51) Int. Cl.
*C23C 16/455* (2006.01)
*H01L 21/205* (2006.01)
(Continued)

(52) U.S. Cl.
CPC .... *C23C 16/45502* (2013.01); *C23C 16/4412* (2013.01); *H01L 21/205* (2013.01); *H01L 21/67739* (2013.01)

(58) Field of Classification Search
CPC .......... C23C 16/45502; C23C 16/4401; C23C 16/4412; C23C 16/54
See application file for complete search history.

(56) References Cited

U.S. PATENT DOCUMENTS 5,261,167 A 11/1993 Sakata
5,551,984 A 9/1996 Tanahashi
(Continued)

FOREIGN PATENT DOCUMENTS

JP 2002-175999 A 6/2002
JP 2007-116089 A 5/2007
(Continued)

OTHER PUBLICATIONS

Japanese Office Action dated Feb. 22, 2018 for the Japanese Patent Application No. 2016-570672.

*Primary Examiner* — Kelly M Gambetta
(74) *Attorney, Agent, or Firm* — Volpe and Koenig, P.C.

(57) ABSTRACT

A substrate processing apparatus includes: a substrate retainer configured to support a substrate; a heat-insulating unit; a transfer chamber; and a gas supply mechanism configured to supply a gas into the transfer chamber, the gas supply mechanism including: a first gas supply mechanism configured to supply the gas into an upper region of the transfer chamber, where the substrate retainer is disposed such that the gas flows horizontally through the upper region; and a second gas supply mechanism configured to supply the gas into a lower region of the transfer chamber, where the heat-insulating unit is provided such that the gas flows downward through the lower region, wherein the first gas supply mechanism and the second gas supply mechanism are disposed along a first sidewall of the transfer chamber, and the second gas supply mechanism is disposed lower than the first gas supply mechanism.

13 Claims, 10 Drawing Sheets

(51) Int. Cl.
*C23C 16/44* (2006.01)
*H01L 21/677* (2006.01)

(56) References Cited

U.S. PATENT DOCUMENTS

| | | |
|---|---|---|
| 10,131,984 B2 | 11/2018 | Okada |
| 2002/0023458 A1 | 2/2002 | Sakata et al. |
| 2008/0105204 A1 | 5/2008 | Nakada et al. |
| 2010/0229416 A1 | 9/2010 | Aburatani et al. |
| 2011/0305543 A1 | 12/2011 | Nakashima et al. |
| 2012/0270170 A1* | 10/2012 | Nitadori ............ H01L 21/67017 432/77 |
| 2019/0019705 A1 | 1/2019 | Nakada et al. |

FOREIGN PATENT DOCUMENTS

| | | |
|---|---|---|
| JP | 2012-169367 A | 9/2012 |
| JP | 2015-002339 A | 1/2015 |

\* cited by examiner

\<Prior Art\>

SUBSTRATE PROCESSING APPARATUS

CROSS-REFERENCE TO RELATED PATENT APPLICATION

This non-provisional U.S. patent application claims priority under 35 U.S.C. § 119 of International Application No. PCT/JP2016/051530, filed on Jan. 20, 2016, in the WIPO, and Japanese Patent Application No. 2015-009394, filed on Jan. 21, 2015, in the Japanese Patent Office, the entire contents of which are hereby incorporated by reference.

BACKGROUND

1. Field

The present disclosure relates to a substrate processing apparatus.

2. Description of the Related Art

Generally, a vertical type substrate processing apparatus used in a semiconductor device manufacturing process includes a transfer chamber. The transfer chamber is installed under a process chamber where a wafer is processed. In the substrate processing apparatus, unprocessed wafer is loaded into a substrate retainer (boat) which is to be transferred from the transfer chamber to the process chamber (wafer charging), and processed wafer is unloaded from the substrate retainer which is transferred out of the process chamber (wafer discharging). In order to cool the processed wafer at a high temperature, which is transferred out of the process chamber, to a predetermined temperature, clean air is supplied to form an airflow in the transfer chamber. A cleaning unit equipped with a filter and a blower is provided at one side of the transfer chamber. By injecting the clean air into the transfer chamber from the cleaning unit, the airflow is formed.

In the conventional transfer chamber, the time consumed for cooling the substrate is long due to the airflow formed in the transfer chamber. That is, a rising air current induced by heat may be generated in the heat-insulating region under the substrate retainer inside the transfer chamber. As a result, the time consumed for cooling the substrate may be prolonged due to the heat spread by the upward flow into the upper portion of the transfer chamber.

SUMMARY

Described herein is a technique for reducing time consumed for cooling a substrate.

According to one aspect of the technique described herein, a substrate processing apparatus may include: a substrate retainer configured to support a substrate; a heat-insulating unit disposed under the substrate retainer; a transfer chamber where the substrate is loaded into the substrate retainer; and a gas supply mechanism configured to supply a gas into the transfer chamber, the gas supply mechanism including: a first gas supply mechanism configured to supply the gas into an upper region of the transfer chamber, where the substrate retainer is disposed such that the gas flows horizontally through the upper region; and a second gas supply mechanism configured to supply the gas into a lower region of the transfer chamber, where the heat-insulating unit is provided such that the gas flows downward through the lower region, wherein the first gas supply mechanism and the second gas supply mechanism are disposed along a first sidewall of the transfer chamber, and the second gas supply mechanism is disposed lower than the first gas supply mechanism.

DETAILED DESCRIPTION

First Embodiment

Hereinafter, a first embodiment will be described with reference to FIGS. 1 through 5.

(1) Configuration of Substrate Processing Apparatus

Figure 1:
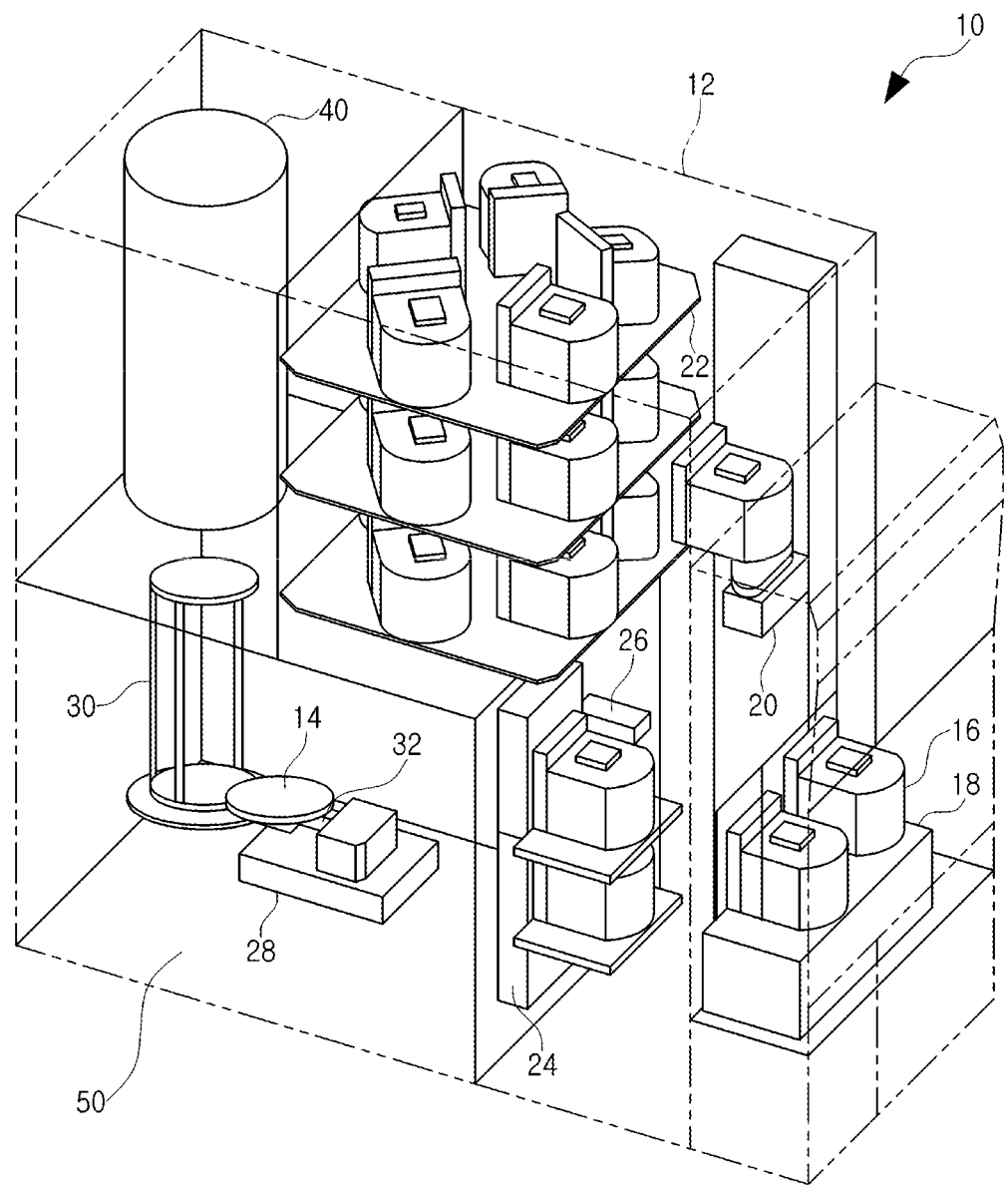
FIG. 1 is a diagram schematically illustrating a perspective view of a substrate processing apparatus according to a first embodiment.
Figure 1:
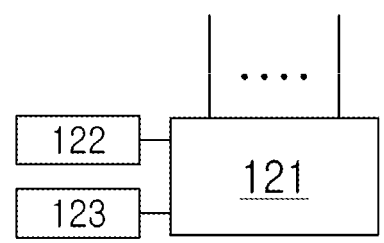

As shown in FIG. 1, a substrate processing apparatus 10 includes a housing 12 in which a processing furnace 40 is disposed. A pod stage 18 is disposed on the front side of the housing 12. A front opening unified pod (FOUP) 16 (hereinafter referred to as "pod"), which is a substrate accommodating mechanism for accommodating a wafer (substrate) 14, is loaded on and unloaded from the pod stage 18. For example, 25 wafers 14 may be accommodated in the pod 16.

A pod transfer device 20 is disposed at positions facing the pod stage 18 on the front side in the housing 12. A pod shelf 22 and a pod opener 24 are disposed in the vicinity of the pod transfer device 20. The pod transfer device 20 is configured to transport the pod 16 among the pod stage 18, the pod shelf 22 and the pod opener 24. The pod shelf 22 is provided with shelf plates in multiple stages to support multiple pods 16. A cap (not shown) of the pod 16 is opened/closed by the pod opener 24.

A transfer chamber 50 is a space in the housing 12. The transfer chamber 50 is disposed closer to the rear side of the inside of the housing 12 than the pod opener 24. The detailed configuration of the transfer chamber 50 will be described later.

A boat 30 serving as a substrate retainer is disposed in the transfer chamber 50. A substrate transfer device 28 is disposed between the transfer chamber 50 and the pod opener 24. The substrate transfer device 28 has an arm 32 (tweezer) capable of transferring, for example, five wafers 14. The substrate transfer device 28 transfers the wafer 14 between the boat 30 and the pod 16 mounted on the pod opener 24 by operating the arm 32 to move up and down and rotate by the driving means (not shown). The boat 30 supports a plurality of wafers 14, for example, 25 to 150 wafers 14, in a horizontal manner in multiple stages. The boat 30 charged with the wafer 14 may be elevated by a boat elevator 34 which is an elevating mechanism. A heat-insulating unit 74 having a heat-insulating effect is provided under the boat 30. The heat-insulating unit 74 may include a plurality of heat-insulating plates 74a made of a heat-resistant material such as quartz and silicon carbide (SiC). The portion of the inside of the transfer chamber 50 corresponding to the region in which the boat 30 is disposed is referred to as "upper region 60" or "substrate region 60" and the portion of the inside of the transfer chamber 50 corresponding to the region in which the heat-insulating unit 74 is disposed is referred to as "lower region 61" or "heat-insulating region 61" Instead of the plurality of heat-insulating plates 74a, the heat-insulating unit 74 may include a heat-insulating cylinder (not shown), which is a cylindrical and made of a heat-resistant material such as quartz and silicon carbide (SiC). The boat 30 itself may also include an upper portion for supporting the substrate 14 and a lower portion for supporting the heat-insulating plate 74a. In this case, the portion of the inside of the transfer chamber 50 corresponding to the region in which the upper portion of the boat 30 is disposed is referred to as "upper region 60", and the portion of the inside of the transfer chamber 50 corresponding to the region in which the lower portion of the boat 30 is disposed is referred to as "lower region 61.".

The processing furnace 40 is disposed above the transfer chamber 50. The boat 30 accommodating the wafers 14 is loaded into the processing furnace 40 from below the processing furnace 40.

<Processing Furnace>

The processing furnace 40 will be described below.

Figure 2:
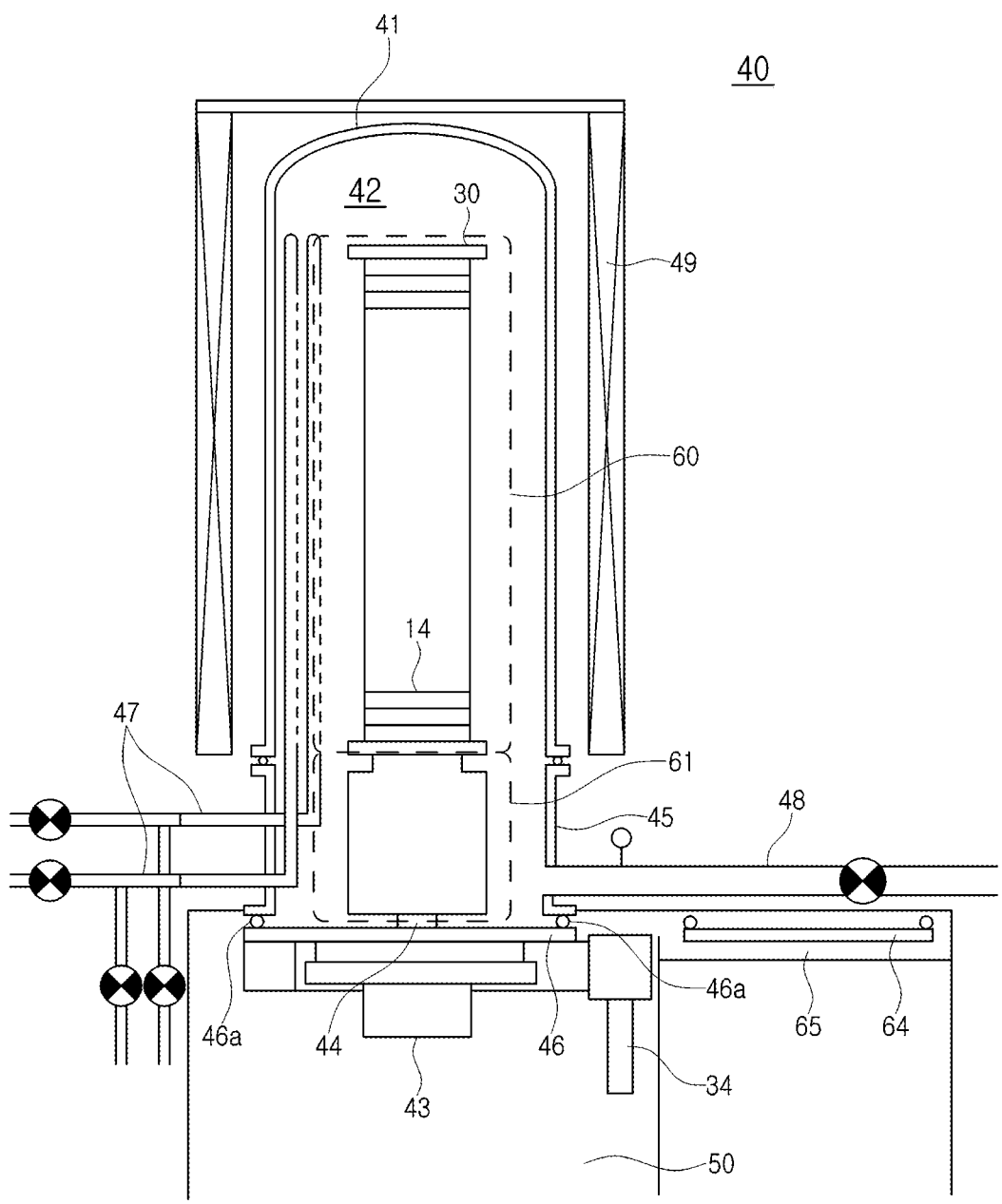
FIG. 2 is a vertical cross-sectional view of a processing furnace used in the substrate processing apparatus according to the first embodiment.

As shown in FIG. 2, the processing furnace 40 includes a substantially cylindrical reaction tube 41. The reaction tube 41 is made of a non-metallic material resistant to heat such as quartz ($SiO_2$) and silicon carbide (SiC). The reaction tube 41 has a closed upper end and an open lower end.

The process chamber 42 is disposed inside the reaction tube 41. The boat 30 accommodated in the process chamber 42 is rotated with the plurality of wafers 14 loaded therein by a rotating mechanism 43.

The reaction tube 41 and a manifold 45 under the reaction tube 41 are concentrically arranged. The manifold 45 is made of a metallic material such as stainless steel and is cylindrical with open upper and lower ends. The manifold 45 vertically supports the lower end of the reaction tube 41. The lower end of the manifold 45 (or the process chamber 42) may be hermetically sealed by a seal cap 46 when the boat elevator 34 is elevated. A sealing member 46a such as an O-ring that hermetically seals the inside of the process chamber 42 is provided between the lower end of the manifold 45 and the seal cap 46. A gas introduction pipe 47 for introducing gases such as a process gas and a purge gas into the process chamber 42 and an exhaust pipe 48 for exhausting the gas in the process chamber 42 are connected to the manifold 45.

A mass flow rate controller (MFC) (not shown), which is a flow rate controller (flow rate control unit) for controlling the flow rate of the process gas, and a valve (not shown) serving as an on/off valve are connected to the gas introduction pipe 47 in order from the upstream side to the downstream side of the gas introduction pipe 47. A nozzle (not shown) is connected to the front end of the gas introduction pipe 47. Various gases are supplied into the process chamber 42 via the MFC, the valve and the nozzle.

The exhaust pipe 48 is connected to a vacuum pump which is an exhaust device through a pressure sensor (not shown) which is a pressure detector (pressure detecting unit) for detecting the inner pressure of the process chamber 42 and an APC (Automatic Pressure Controller) valve which is a pressure regulator.

A heater 49 serving as the heating means (heating mechanism) is disposed concentrically with the reaction tube 41 on the outer periphery of the reaction tube 41. The heater 49 is configured to heat the inside of the process chamber 42 such that the inner temperature of the process chamber 42 is uniform or has a predetermined temperature distribution throughout the inside of the process chamber 42.

A temperature sensor (not shown), which is a temperature detector, is installed in the reaction tube 41. The inner temperature of the process chamber 42 is adjusted to a desired temperature distribution by adjusting the electric power applied to the heater 49 based on the temperature detected by the temperature sensor.

The controller 121 is connected to and configured to control the MFC, the valve, the pressure sensor, the APC valve, the vacuum pump, the heater 49, the temperature sensor, the rotating mechanism 43, the boat elevator 34 and fans 56a, 56b. The controller 121 is embodied by a microprocessor (computer) having a CPU, for example, and is configured to control the operation of the substrate processing apparatus 10. For example, an input/output device 122 such as a touch panel is connected to the controller 121.

A memory unit 123, which is a storage medium, is connected to the controller 121. A control program for controlling the operation of the substrate processing apparatus 10 or a program (also referred to as a recipe) for controlling the operations of each component of the substrate processing apparatus 10 to perform the processing of the substrate according to processing conditions is readably stored in the memory unit 123.

The memory unit 123 may include a storage device (a hard disk or a flash memory) built into the controller 121 and may also include a portable external storage device (magnetic tape, magnetic disks such as flexible disk and hard disks, optical disks such as CD and DVD, magneto-optical disks such as MO, and semiconductor memory such as USB memories and memory cards). The program may be provided to the computer using a communication means such as the Internet and a dedicated line. The program can be read from the memory unit 123 by an instruction from the input/output device 122 when necessary. By performing processes according to the recipe read by the controller 121, each component of the substrate processing apparatus 10 performs desired processing under the control of the controller 121.

(2) Substrate Processing Step

Next, a step (substrate processing step) for processing the wafer 14, which is one of semiconductor device manufacturing processes, using the substrate processing apparatus 10 according to the first embodiment will be described. Hereinafter, the controller 121 controls the components that constitute the substrate processing apparatus 10.

<Wafer Transfer Step>

The substrate transfer device 28 unloads the wafer 14 from the pod 16 placed on the pod opener 24 and transfers the wafer 14 to the boat 30 in the transfer chamber 50 (wafer charging).

<Boat Loading Step>

Thereafter, a shutter 64 for closing the wafer loading/unloading port 51 at the lower portion of the process chamber 42 is retreated to be accommodated in the receiving portion 65, thereby opening the wafer loading/unloading port 51. Subsequently, the boat 30 charged with the wafer 14 is lifted from the transfer chamber 50 by the boat elevator into the process chamber 42 from the transfer chamber 50.

<Wafer Processing Step>

A predetermined processing is performed on the wafer 14 charged in the boat 30 accommodated in the process chamber 42. For instance, when a film-forming process by a thermal CVD reaction is to be performed, the inside atmosphere of the process chamber 42 is exhausted through the exhaust pipe 48 and the inner pressure of the process chamber 42 is adjusted to a desired pressure (vacuum level). The boat 30 is rotated by the rotating mechanism 43 while the inside of the process chamber 42 is heated by the heater 49. Gases such as source gas are supplied into the process chamber 42 through the gas introduction pipe 47. As a result, a thin film is formed on the surface of the wafer 14 charged in the boat 30 by a thermal decomposition and a chemical reaction.

After the thin is formed, the supply of the source gas is stopped and an inert gas is supplied into the process chamber 42. As a result, the inner atmosphere of the process chamber 42 is replaced with the inert gas and the inner pressure of the process chamber 42 is returned to atmospheric pressure.

<Boat Unloading Step>

The seal cap 46 is lowered by the boat elevator 34 and the lower end of the manifold 45 is opened. The boat 30 is then unloaded from the process chamber 42 through the lower end of the manifold 45 (boat unloading). Thereafter, the shutter 64 closes the wafer loading/unloading port 51 of the process chamber 42. The boat 30 waits at a predetermined position in the transfer chamber 50 until the wafer 14 is cooled.

<Discharging Step>

When the wafer 14 is cooled to a predetermined temperature (for example, about room temperature), the wafer 14 is unloaded from the boat 30 by the substrate transfer device 28 and transferred to the pod 16 (wafer discharging).

As described above, a series of substrate processing operations of the substrate processing apparatus 10 according to the first embodiment is completed.

(3) Configuration of the Transfer Chamber

Next, the configuration of the transfer chamber 50 according to the first embodiment will be described with reference to FIGS. 3 through 6.

<Transfer Chamber>

Figure 3:
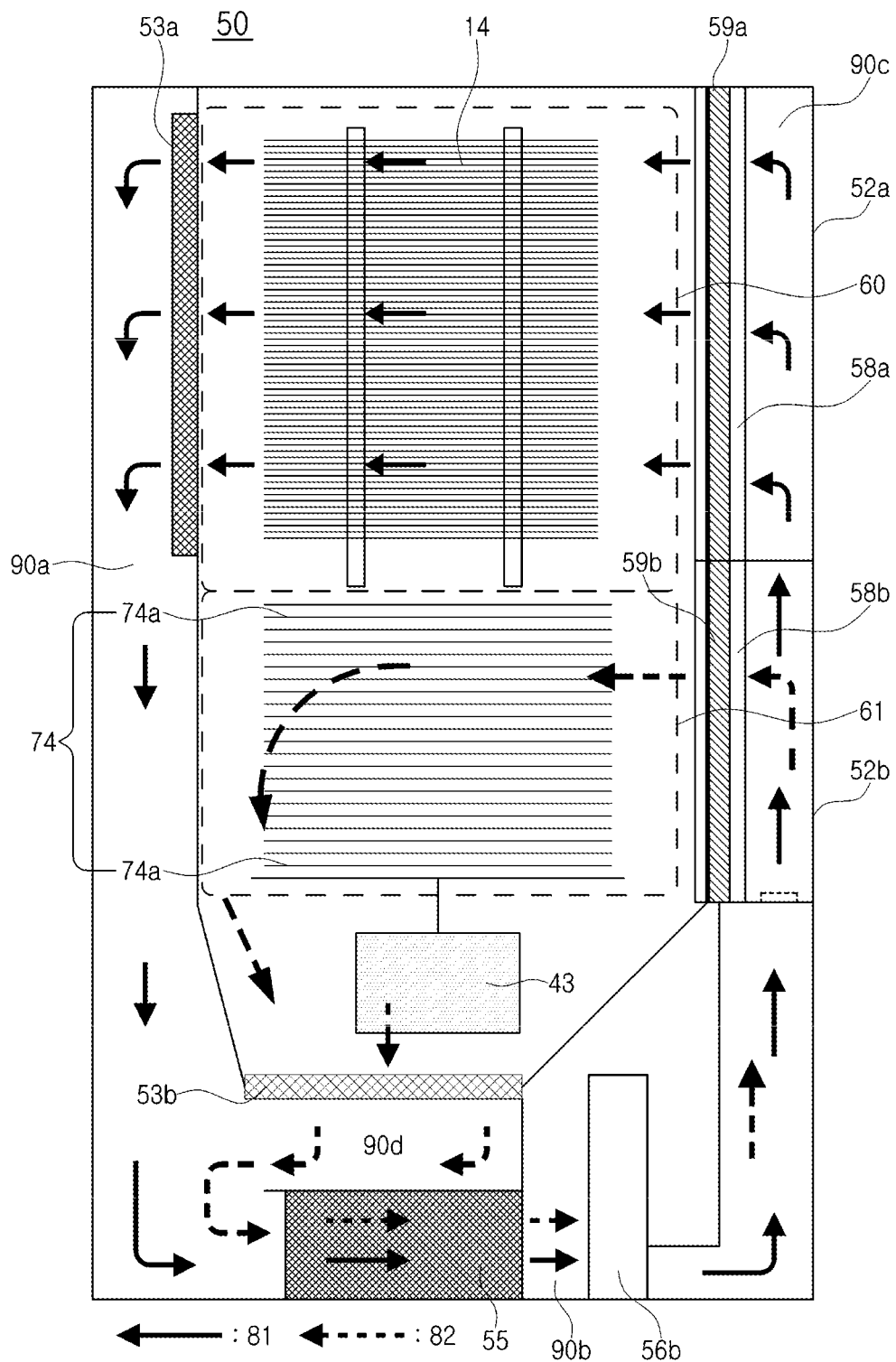
FIG. 3 is a diagram exemplifying a vertical cross-section of a transfer chamber of the substrate processing apparatus and a gas flow in the transfer chamber of the substrate processing apparatus according to the first embodiment.

As shown in FIG. 3, the transfer chamber 50 has a rectangular shape defined by a ceiling, a floor and side walls. However, the shape of the transfer chamber 50 is not limited to the rectangular shape but may be polygonal (e.g., triangular, pentagonal and the like). The inner atmosphere of the transfer chamber 50 may be, but is not limited to, vacuum or inert gas atmosphere, which is the inner atmosphere of a loadlock chamber (not shown) or a nitrogen purge box (not shown). The inner atmosphere of the transfer chamber 50 may be air.

A hole which is in communicating with the wafer loading/unloading port 51 is provided at the ceiling of the transfer chamber 50. The hole has a shape and size such that the boat 30 holding the wafer 14 can pass.

Gas supply mechanisms 52a and 52b and exhaust units 53a and 53b which are constituents of the cleaning units, the boat 30 and the boat elevator 34 are disposed in and around the transfer chamber 50. Circulation paths 81 and 82, which will be described later, are provided in a space around the transfer chamber 50.

A portion below a first sidewall of the transfer chamber 50 on which the gas supply mechanisms 52a and 52b are provided and a portion below a second sidewall of the transfer chamber 50 on which the exhaust unit 53a is provided are inclined inward toward the vertical center line of the transfer chamber 50. That is, the portion of the transfer chamber 50 lower than the lower end of the heat-insulating region 61 which is the lowermost portion of the boat 30, has a funnel shaped vertical cross-section. In other words, the horizontal cross-sectional area of the transfer chamber 50 about the exhaust unit 53b is smaller than the horizontal cross-sectional area of the transfer chamber 50 about the heat-insulating region 61, and the horizontal cross-sectional area of the transfer chamber 50 below the lowermost portion of the boat 30 becomes gradually smaller closer to the exhaust unit 53b. Preferably, the slope below the first sidewall on which the gas supply mechanisms 52a and 52b are installed is less inclined than the slope below the second sidewall on which the exhaust unit 53a is installed. More preferably, the length of the slope below the first sidewall on which the gas supply mechanisms 52a and 52b are installed is longer than the length of the slope below the second sidewall on which the exhaust unit 53a is installed. This structure facilitates the vertical down flow of the gas in the heat-insulating region 61.

<Gas Supply Mechanism>

The gas supply mechanisms 52a and 52b are provided on one side wall of the transfer chamber 50 vertically adjacent to each other, and are configured to supply gas clean air into the transfer chamber 50. The gas supply mechanism 52a is configured to supply gas into an upper region 60 which is the upper portion of the inside space of the transfer chamber 50 and also the wafer stacking region of the boat 30. The gas supply mechanism 52a is configured to supply gas into a lower region 61 which is the lower portion of the inside space of the transfer chamber 50 under the wafer stacking region and also the heat-insulating region 61.

In the first embodiment, an inert gas is used as the clean air. However, an external atmosphere may be used as the clean gas. Even when the external atmosphere is used, the external atmosphere may be filtered by filter units 59a and 59b, which are described later, to be used as a clean atmosphere (clean air). Hereinafter, the term "gas supply mechanism" may refer to one of the gas supply mechanisms 52a and 52b, or may refer to both of gas supply mechanisms 52a and 52b.

Figure 5A:
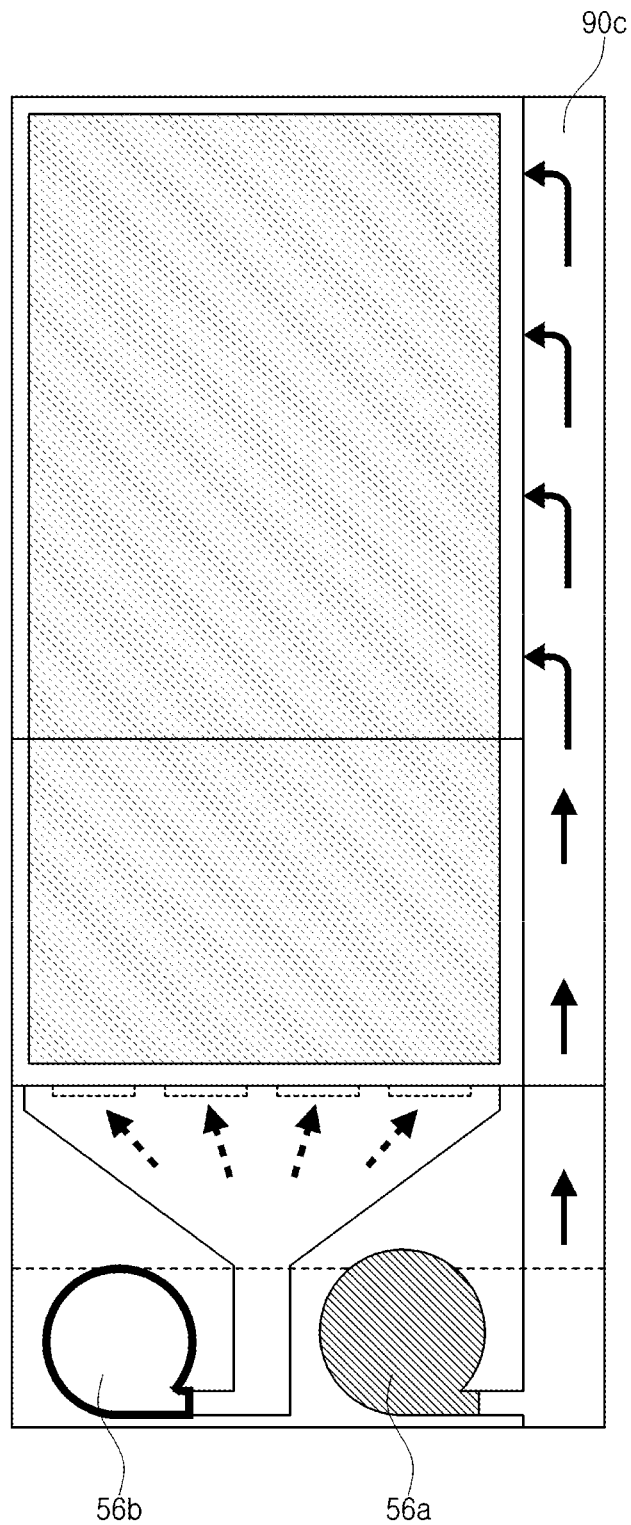
FIG. 5A is a diagram illustrating a gas supply mechanism of the transfer chamber of the substrate processing apparatus according to the first embodiment.
Figure 5B:
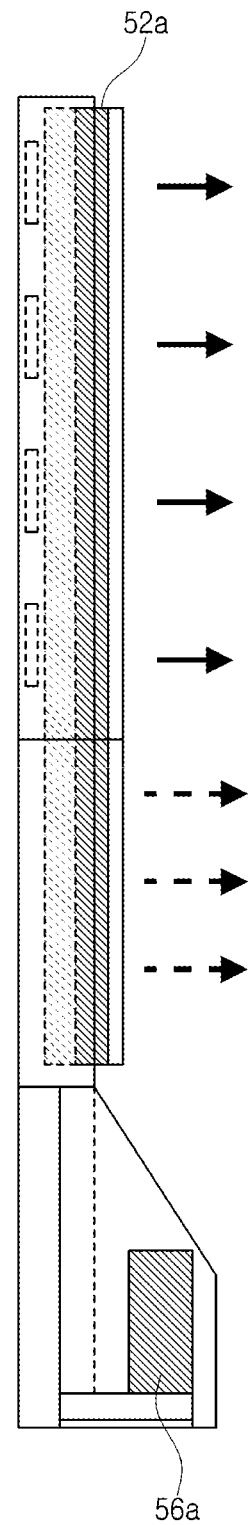
FIG. 5B is a diagram illustrating a side surface of the gas supply mechanism.

As shown in FIG. 5A, the gas supply mechanism 52a includes, from the upstream side to the downstream side of the gas flow, the fan 56a (first ventilation unit) configured to ventilate gas, a duct 90c which defines a gas path for guiding the gas ventilated by the fan 56a to a buffer region 58a, the buffer region 58a spatially connected to the duct 90c, which is a diffusion space of the gas for uniformly supplying gas into the upper region 60, the filter unit 59a configured to remove particles in the gas and a gas supply port (not shown) configured to inject gas passed through the filter unit 59a into the upper region 60. As shown in FIG. 5B, the duct 90c extends along the sidewall of the buffer region 58a and is configured to supply gas from the lateral side of the buffer region 58a. The fan 56a is provided at the lower end of the gas supply mechanism 52a.

The gas supply mechanism 52b includes, from the upstream side to the downstream side of the gas flow, the fan unit 56b (second ventilation unit) configured to ventilate gas, a duct 90e which defines a gas path for guiding the gas ventilated by the fan unit 56b to a buffer region 58b, the buffer region 58b spatially connected to the duct 90e, which is a diffusion space of the gas for uniformly supplying gas into the lower region 61, the filter unit 59b configured to remove particles in the gas and a gas supply port (not shown) configured to inject gas passed through the filter unit 59b into the lower region 61. The duct 90e is provided at a lower surface of the buffer region 58b and is configured to supply gas through the lower surface of the buffer region 58b. The fan 56b is provided adjacent to the gas supply mechanism 52b at the lower end thereof.

Thus, the gas supply mechanism is vertically divided at the boundary of the upper region 60 and the lower region 61, and each divided structure has independent gas path. As a result, different gas flows may be formed or the gas may be supplied at different flow rates for the upper region 60 and lower region 61. In the first embodiment, the filter units 59a and 59b may include, for example, two layers of a chemical and PTFE.

<Exhaust Unit>

As shown in FIG. 3, the exhaust units 53a and 53b are provided on the sidewall of the transfer chamber 50 other than the sidewall of the transfer chamber 50 on which the gas supply mechanisms 52a and 52b are provided. The exhaust units 53a and 53b are configured to exhaust the gas (including the gas containing particle) in the transfer chamber 50 to the outside of the transfer chamber 50.

The exhaust unit 53a is configured to exhaust the gas supplied to the upper region 60 through the sidewall. The exhaust unit 53a is provided at a portion of a sidewall in the upper region 60 facing the gas supply mechanism 52a with the boat 30 interposed therebetween. In the first embodiment, the boat elevator 34 extending vertically is installed at a side where the exhaust unit 53a is installed. The gas exhausted through the first exhaust unit 53a flows in a duct 90a. The duct 90a is narrowed starting from the second exhaust unit 53b. That is, the side surface provided with the exhaust unit 53a is divided into left and right side surfaces by the boat elevator 34. Therefore, the exhaust unit 53a is not installed over the entire width of the sidewall along which the exhaust unit 53a is installed, but on the sidewall of one of the left and right sidewalls divided by the boat elevator 34. The exhaust unit 53a includes, for example, a plurality of vertically elongated opening disposed at positions corresponding to the upper region 60. However, the exhaust unit 53a is not limited thereto. The exhaust unit 53a may include a punched panel. The exhaust unit 53a may be installed on both the left and right sidewalls divided by the boat elevator 34.

The exhaust unit 53b is configured to exhaust the gas supplied to the lower region 61 through the bottom surface of the transfer chamber 50 which is perpendicular to the first sidewall on which the gas supply mechanism 52b is provided. The width of the exhaust unit 53b is smaller than that of the seal cap 46. The center of the exhaust unit 53b deviates from the vertical center line of the transfer chamber 50 when viewed laterally such that the center of the exhaust unit 53b and the center of the gas supply mechanism 52b are misaligned about the vertical center line of the transfer chamber 50. By deviating the exhaust unit 53b, the vertical down flow of the gas through the space between the insulating plates 74 and the second sidewall on which the exhaust unit 53b is installed. The exhaust unit 53b may include a punched panel in order to quickly exhaust the gas supplied to the lower region 61.

<Circulation Paths>

The gas exhausted from the inside of the transfer chamber 50 is supplied back into the transfer chamber 50 via a first circulation path 81 indicated by the solid line arrow and the second circulation path 82 indicated by the broken line arrow. The first circulation path 81 is a gas path for supplying the gas exhausted from the upper region 60 through the exhaust unit 53a back into the upper region 60 via the gas supply mechanism 52a. The second circulation path 82 is a gas path for supplying the gas exhausted from the lower region 61 through the exhaust unit 53b back into the lower region 61 through the gas supply mechanism 52b. Hereinafter, the term "circulation path" may refer to one of the circulation paths 81 and 82 or may refer to both of the circulation paths 81 and 82.

The first circulation path 81 is constituted by the ducts 90a and 90b and the gas supply mechanism 52a. The duct 90a is a path connecting the exhaust unit 53a and the duct 90b, and disposed at the downstream side of the exhaust unit 53a. The duct 90b is a path spatially connected to the duct 90a and the gas supply mechanism 52a, which is a space under the bottom of the transfer chamber 50. In the first embodiment, the duct 90b is spatially connected to the fan 56a. The first circulation path 81 may further include the exhaust unit 53a.

The second circulation path 82 is constituted by the ducts 90a and 90b and the gas supply mechanism 52b. A duct 90d is a path spatially connected to the exhaust unit 53b and the duct 90b, which is a space under the exhaust unit 53b. In the first embodiment, the dust 90d may be spatially connected to a lower portion of the duct 90a. The duct 90b is a path spatially connected to the duct 90d and the gas supply mechanism 52b, which is a space under the bottom of the transfer chamber 50. In the first embodiment, the duct 90b is spatially connected to the fan 56a. The second circulation path 82 may further include the exhaust unit 53b.

The first circulation path 81 and the second circulation path 82 partially converge in the duct 90b. That is, the duct 90d is spatially connected to the ducts 90a and 90b and also spatially connected to with the gas supply mechanism 52a and the gas supply mechanism 52b. In a portion other than the duct 90b, the second circulation path 82 is independent from the first circulation path 81. That's is, a portion of the second circulation path 82 in the lower region 61, the duct 90d and the gas supply mechanism 52b are independent from the first circulation path 81. The total length of the path along the second circulation path 82 is shorter than the total length of the path along the first circulation path 81.

Figure 4:
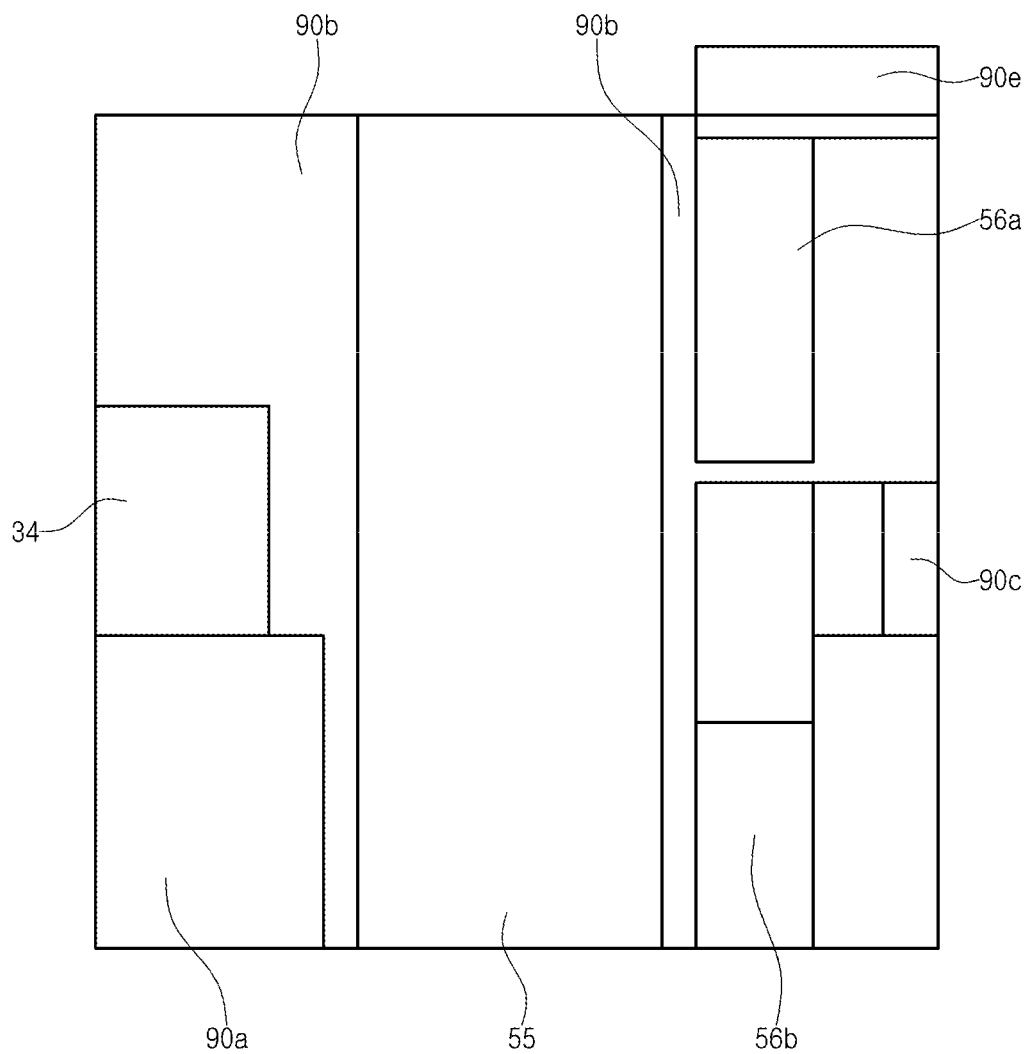
FIG. 4 is a plan diagram exemplifying a lower space of the transfer chamber of the substrate processing apparatus according to the first embodiment.

As shown in FIG. 4, a cooling unit (radiator) 55, which cools the gas, is disposed in the duct 90b. The fans 56a and 56b are provided at the connecting portion of the gas supply mechanism 52a and 52b, i.e. at the lower ends of the gas supply mechanism 52a and 52b which are also the end portion of the duct 90b. By adjusting the outputs of the fans 56a and 56b, the flow rate or the flow velocity of the gas supplied to each gas supply mechanism can be adjusted. In the first embodiment, the output of the fan 56*a* may be greater than that of the fan 56*b*.

A gas damper (not shown) may be provided in the first circulation path 81 and the second circulation path 82. The gas damper is configured to adjust the flow rate of the gas flowing through the circulation paths 81 and 82. For example, the gas damper may be embodied using known flow control mechanisms such as butterfly valves and needle mechanisms. The gas damper is capable of automatically controlling the flow rate, and is preferably configured to perform the interlocking control with the fans 56*a* and 56*b*.

<Formation of Gas Flow in the Transfer Chamber>

Next, the gas flow formed in the transfer chamber 50 will be described.

Comparative Example

Figure 8:
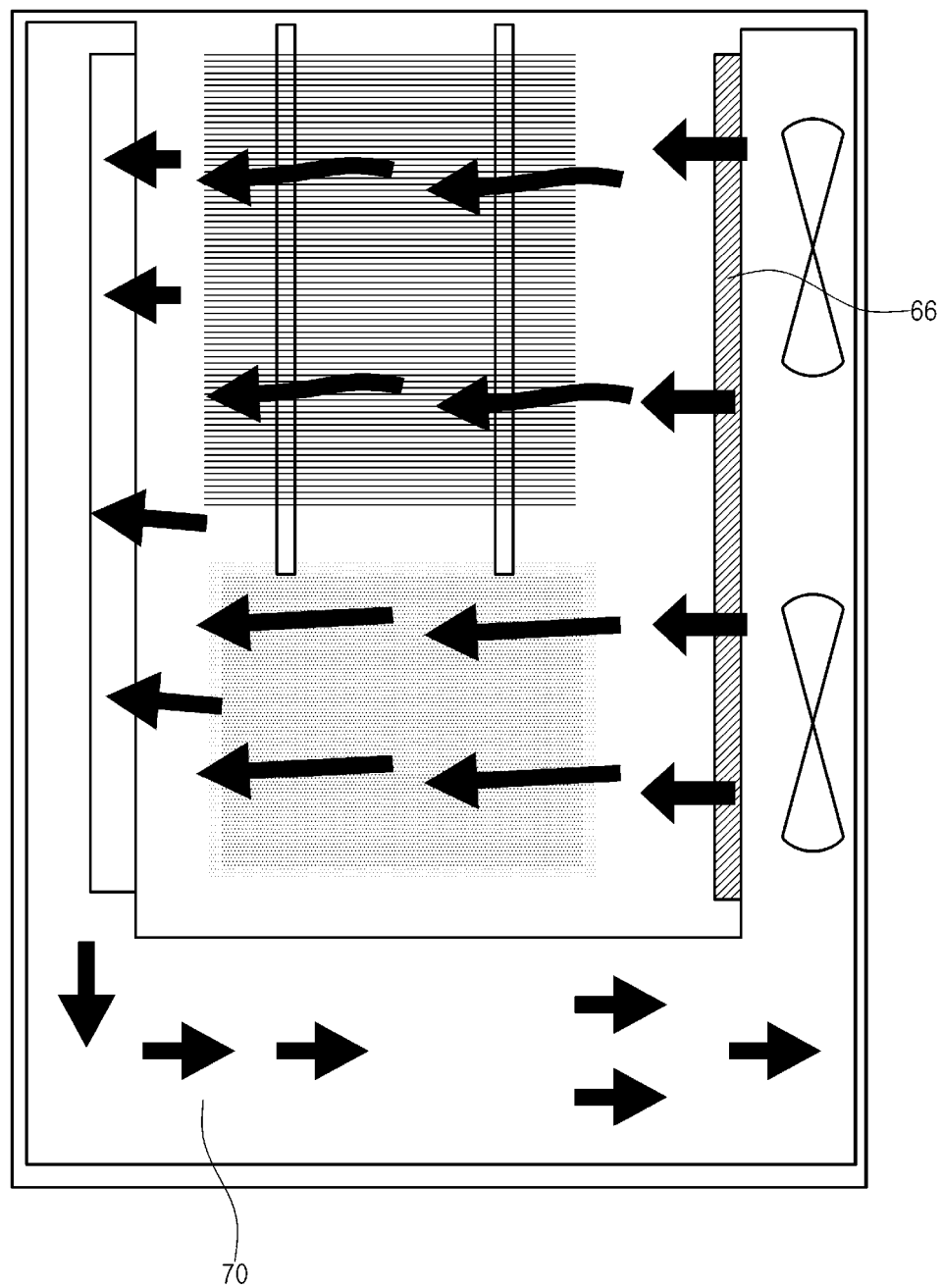
FIG. 8 is a diagram showing a gas flow in a conventional transfer chamber.

Here, the configuration of a conventional transfer chamber, which is a comparative example, will be described with reference to FIG. 8 prior to describing the gas flow formed in the transfer chamber 50 according to the first embodiment.

In the conventional substrate processing apparatus, a gas supply mechanism 66 having a filter and a fan is installed in a transfer chamber 50 along one sidewall of the transfer chamber 50. A circulation path for supplying gas in the transfer chamber 50 back into the transfer chamber 50 by the gas supply mechanism 66 is formed in the lower portion of the transfer chamber 50. According to this conventional configuration, the flow of gas formed in the transfer chamber 50 is horizontal starting from the gas supply mechanism 66 in the entire portion of the transfer chamber 50 (hereinafter, the flow of the gas in the horizontal direction is referred to as "horizontal flow").

Generally, the temperature difference exists between the heat-insulating region 61 and the substrate region 60 occurs because the substrate cools down faster than the insulating plate. As a result, a rising air current is generated in the heat-insulating region 61 which has a temperature higher than the substrate region 60 in the transfer chamber 50. Since the gas flow formed by the conventional substrate processing apparatus is horizontal in the heat-insulating region 61, an up flow of gas generated in the heated heat-insulating region 61 can not be suppressed. The cooling efficiency of the substrate is degraded and the particles adhere to the substrate as the heat and the particles diffuse into the upper portion of the inside of the transfer chamber 50 by the up flow of gas to reach the substrate region 60. The thermal influence by radiation on the sensors in the transfer chamber 50 is increased by the heat-insulating plate 74*a* having a high heat capacity. Therefore, even when a structure such as a cover is added to the sensor, the thermal influence may not be sufficiently suppressed. As a result, the sensor may malfunction or fail.

Gas Flow According to the First Embodiment

The inventors of the present application have found, as a result of an extensive research to form an optimal gas flow in the transfer chamber 50, that it is preferable to circulate the gas by forming a down flow (downward gas flow in vertical direction) of gas in the heat-insulating region 61 to suppress the up flow of gas. Accordingly, the inventor of the present application has developed a structure in which a horizontal flow is formed in the upper region, which is the substrate region 60, and the down flow of gas is formed in a lower region, which is the heat-insulating region 61.

Next, the gas flow in accordance with the first embodiment will be described in detail with reference to FIG. 3. The solid line arrows in FIG. 3 represent the gas flow in the first circulation path 81, and the dashed line arrows represent the gas flow in the second circulation path 82.

First, the gas flow in the first circulation path 81 will be described. The gas supplied to the upper region 60 through the gas supply port of the gas supply mechanism 52*a* flows horizontally parallel to the substrate. The gas that has cooled the wafer 14 is exhausted horizontally through the exhaust unit 53*a* and flows downward in the duct 90*a*. Thereafter, the direction of the gas flow in the connecting portion between the ducts 90*a* and 90*b* is changed from the downward direction to the horizontal direction such that the gas flows into the duct 90*b* toward the fan 56*a* of the gas supply mechanism 52*a* in the horizontal direction. The gas passes through and is cooled by the cooling unit 55 provided in the duct 90*b*. Thereafter, the gas is ventilated by the fan 56*a* into the duct 90*c* and flows vertically upward in the duct 90*c*. The gas, which has flown upward in the duct 90*c*, passes through the connecting portion of the duct 90*c* and the buffer region 58*a* horizontally. The gas is then diffused into the buffer region 58*a*, and then supplied back into the upper region 60 via the filter unit 59*a* and the supply port.

Next, the gas flow in the second circulation path 82 will be described. The gas supplied horizontally to the lower region 61 through the supply port of the gas supply mechanism 52*b* is exhausted downward through the exhaust unit 53*b*. Thus, the direction of gas flow is changed to downward in the lower region 61. That is, the direction of the gas flow is changed to downward with respect to the insulating plate 74. Specifically, the gas flows horizontally between the insulating plates 74, and then flows downward in vertical direction when the gas is exposed to a space between the insulating plate 74 and the inner surface of the transfer chamber 50. Some of the gas flows downward along the space between the insulating plates 74 and the inner surface of the transfer chamber 50 and then exhausted without passing through the space between the insulating plates 74.

The gas that has cooled the insulating plate 74 is exhausted downward through the exhaust unit 53*b*. The direction of the gas flow changes from the downward direction to the horizontal direction in the duct 90*d*. The gas horizontally flowing in the duct 90*d* joins the gas flowing along the first circulation path 81 in the duct 90*b* and flows in the duct 90*b* in the horizontal direction opposite to the direction in which the gas flows in the duct 90*d*. The gas passes through and is cooled by the cooling unit 55 provided in the duct 90*b*. Thereafter, the gas is blown into the duct 90*e* by the fan 56*b* and flows vertically upward in the duct 90*e*. The gas, which has flown upward in the duct 90*e*, passes through the connection portion of the duct 90*e* and the buffer region 58*b* vertically. The gas is then diffused into the buffer region 58*b*, and then supplied back into the lower region 61 via the filter unit 59*b* and the supply port.

It is preferable that the total amount of gas supplied by the gas supply mechanism 52*a* and 52*b* and the total amount of gas exhausted by the exhaust units 52*a* and 52*b*. However, since the temperature of the wafer varies depending on the contents of processing (e.g. type of the film) performed in the process chamber 42, the total amount of gas may be suitably selected.

Next, the heat flow in the transfer chamber 50 according to the first embodiment will be described. The heat radiated from the wafer 14 in the upper region 60 is cooled by the gas supplied through the gas supply mechanism 52*a*. The gas heated by the wafer 14 is exhausted horizontally from the transfer chamber 50 through the exhaust unit 53a.

The heat radiated from the insulating plate 74 of the lower region 61 is cooled by the gas supplied through the gas supply mechanism 52b. Since the down flow of gas is formed in the lower region 61, the heated gas is forcibly discharged through the exhaust unit 53b in the transfer chamber 50 in the downward direction. That is, by forming a gas flow of opposite direction in the lower region 61 which is the source of the up flow of gas, the up flow of gas can be suppressed.

Effects According to the First Embodiment

One or more advantageous effects described below are provided according to the first embodiment.

(a) The gas supply mechanism, which is provided on one sidewall of the transfer chamber 50, is divided into two parts in two regions, namely the upper region 60 where the substrate is cooled and the lower region 61 where the heat-insulating unit 74 is cooled. Thus, different gas flows may be formed in the substrate region 60 and the heat-insulating region 61.

(b) Horizontal flow is formed in the upper region 60 by installing the exhaust unit 53a configured to exhaust the upper region 60 on the sidewall facing the gas supply mechanism and the down flow of gas is formed in the upper region 60 by installing the exhaust unit 53b configured to exhaust the lower region 61 at the bottom of the transfer chamber. Thus, the atmosphere of the lower region 61, which is higher in temperature than that of the upper region 60, may be forcibly exhausted downward to suppress the up flow of gas in the lower region 61. The heat from the heat-insulating unit 74 with high heat capacity may be suppressed from flowing into the substrate region 60 to reduce the time consumed to cool the substrate. The particles may be suppressed from rising by the high-temperature up flow of gas, thereby preventing that the adhesion of the particles to the substrate.

(c) The smaller horizontal cross-sectional area of the transfer chamber 50 under the heat-insulating unit 74 than the horizontal cross-sectional area of the transfer chamber about the heat-insulating unit 74 improves the flow rate of the gas toward the exhaust unit may be improved and the stagnation of the gas toward the exhaust unit may be suppressed.

(d) By deviating the exhaust unit 53b in the lower region 61, the vertical down flow of the heated gas through the space between the edges of the insulating plates 74 and the sidewall opposite to the sidewall on which the gas supply mechanism is installed. As a result, the up flow of the gas and the stagnancy of the gas in the lower region 61 may be suppressed to improve the efficiency of cooling of the substrate and the heat-insulating unit. In addition, by deviating the exhaust unit 53b, a space is secured at the opposite side, and the space may be utilized to accommodate the fans to reduce the footprint.

(e) Since the slope below the first sidewall on which the gas supply mechanisms 52a and 52b are installed is less inclined than the slope below the second sidewall on which the exhaust unit 53a is installed, the stagnancy of the gas may be suppressed and overall balance of the flow velocity of the gas in the lower region 61 may be improved. By making the slope below the first sidewall on which the gas supply mechanisms 52a and 52b are installed is less inclined, a smooth gas flow may be formed without affecting the flow velocity of the gas and the stagnancy of gas in the corners of the transfer chamber 50 may be suppressed. The flow velocity of the gas is reduced by passing through the heat-insulating unit 74 near the gas supply mechanism 52b. However, the slope facilitates smooth flow of the gas and the reduction of the flow velocity is compensated.

(f) The increase in the width of housing may be suppressed and the footprint may be reduced by installing the fans below the gas supply mechanism (g) By making the total length of the circulation path of the lower region 61 to be shorter than the total length of the circulation path of the upper region 60, the circulation cycle of the gas supplied to the lower region 61 may be shortened and the cooling efficiency for cooling the heat-insulating unit 74 may be improved.

(h) The balance in the flow of gas may be improved by setting the total volume of air exhausted by the exhaust units 53a and 53b installed in the transfer chamber 50 to be equal to that of air supplied by the gas supply mechanism.

(i) The flow rate of the gas supplied through each gas supply mechanism may be adjusted by adjusting the output of the fan 56a of the circulation path of the substrate region 60 and the output of the fan 56b of the circulation path of the heat-insulating region 61.

Figure 6:
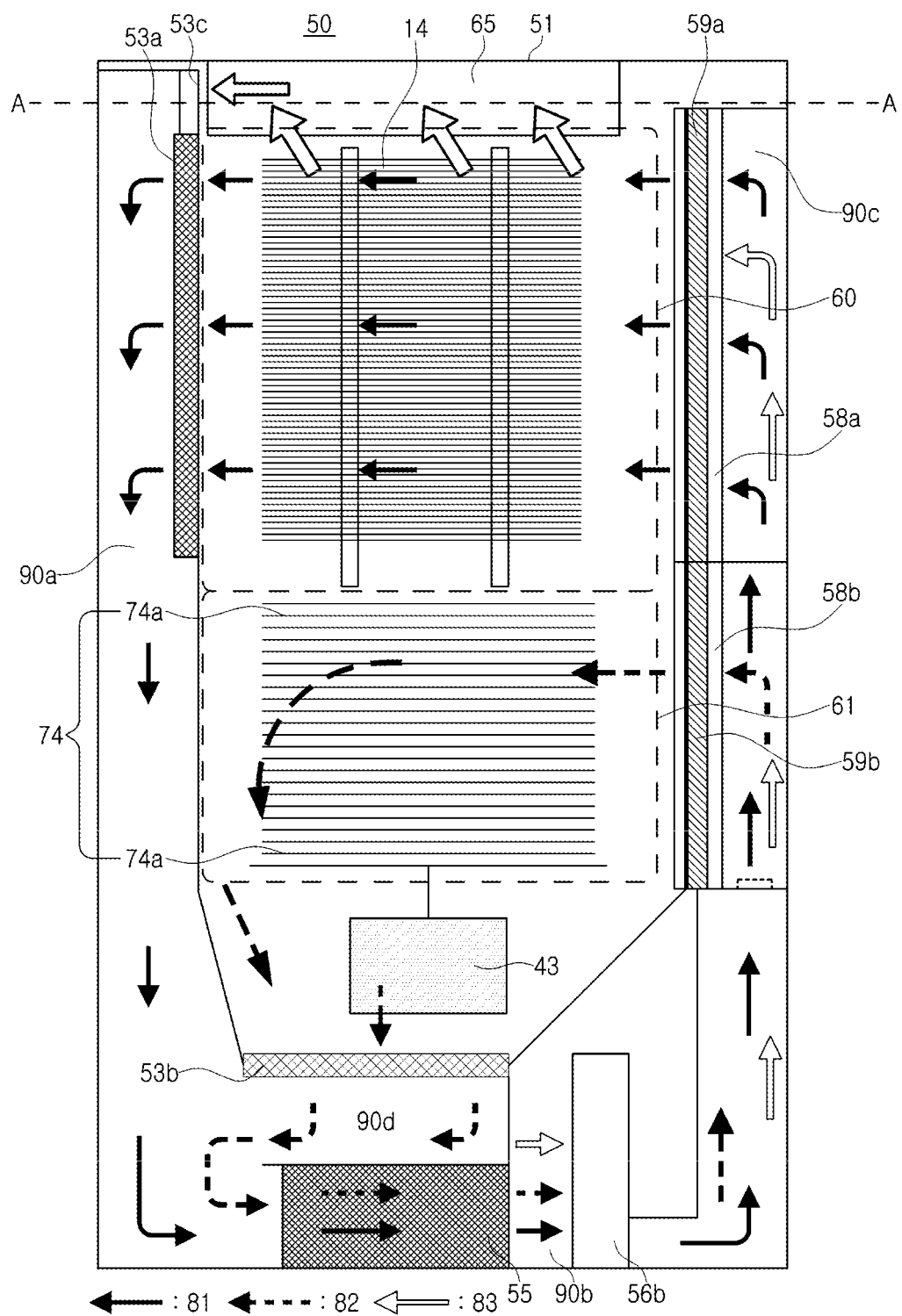
FIG. 6 is a diagram exemplifying a vertical cross-section of a transfer chamber of a substrate processing apparatus according to a second embodiment and a gas flow in the transfer chamber of the substrate processing apparatus according to the second embodiment.
Figure 7:
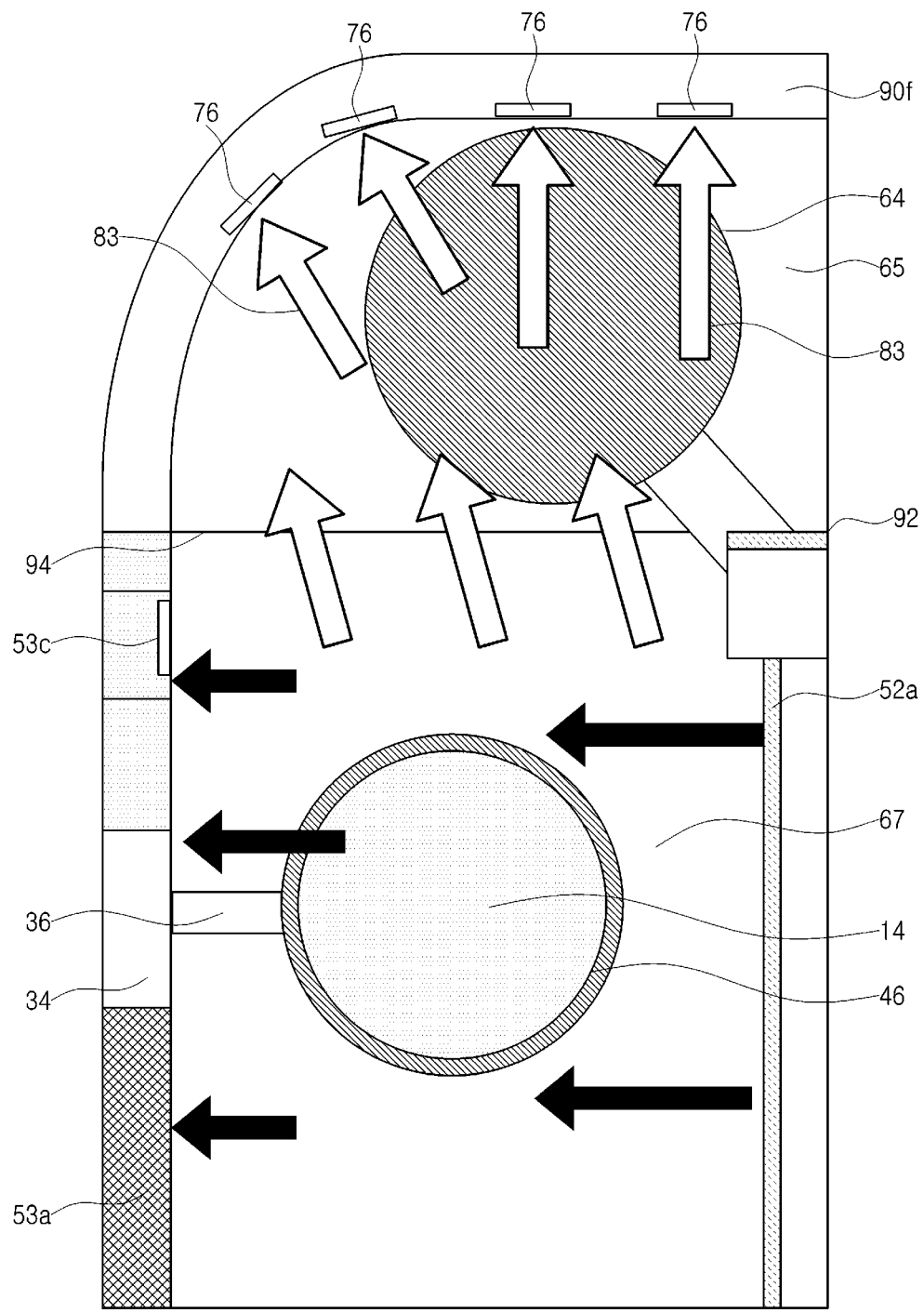
FIG. 7 is a diagram schematically illustrating a receiving portion of the substrate processing apparatus and a gas flow in the receiving portion according to the second embodiment.

Next, the second embodiment is described with reference to FIGS. 6 and 7. The second embodiment differs from the first embodiment in that an exhaust unit 53c configured to exhaust the gas supplied into the receiving portion 65 accommodating the shutter 64 is provided on the sidewall of the receiving portion 65 and a third circulation path 83 is provided in the receiving portion 65. The gas supplied into the receiving portion 65 near the wafer loading/unloading port 51 is exhausted through the exhaust port 53c via the third circulation path 83. A gas flow is formed by the third circulation path 83 in the receiving portion 65 which is located higher than the upper region 60. In a second embodiment, the third circulation path 83 and the first circulation path 81 may partially share a path. That is, the third circulation path 83 is branched from the first circulation path 81. In other words, the third circulation path 83 is a part of the first circulation path 81.

The inside of the receiving portion 65 is purged by ejecting the gas supplied to the upper region into the receiving portion 65 through the exhaust unit 53c. As shown in FIG. 7, the receiving portion 65 protrudes outward from the sidewall of the transfer chamber 50. The receiving portion 65 has a rounded corner when viewed from above. In a second embodiment, the receiving portion 65 is rectangular with one rounded corner. That is, a curved portion is provided at the intersection of two adjoining straight portions of the receiving portion 65. The exhaust unit 53c includes a plurality of exhaust ports 76 disposed along the curved portion and one of the two adjoining straight portion which is one side surface of the receiving portion 65. The number of the exhaust ports 76 provided in the curved portion is the same as the number of the exhaust ports 76 provided in the straight portion. In the second embodiment, two exhaust ports 76 are provided in each of the curved portion and the straight portion. The two exhaust ports 76 provided in the curved portion are disposed closer to the straight portion provided with another two exhaust ports 76 rather than a connecting port 94.

In a second embodiment, the exhaust unit 53c may extend vertically along a sidewall other than one provided with the exhaust unit 53a. By locally exhausting through the exhaust unit 53c, the stagnant gas in a corner of the transfer chamber may be exhausted efficiently.

The third circulation path 83 which cyclically exhausts the receiving portion 65 is constituted by ducts 90f, 90b and 90c. The duct 90f is connected to the exhaust unit 53c and is provided at the back side of the exhaust unit 53c. The duct 90f is connected to the duct 90b. The third circulation path 83 and the first circulation path 81 share a path at the downstream side of the duct 90b.

Next, a gas flow formed by the third circulation path 83 will be described with reference to FIGS. 6 and 7. A portion of the gas supplied to the upper region 60 of the transfer chamber 50 is introduced into the receiving portion 65 via the connecting port 94 which connects the transfer chamber 50 and the receiving portion 65. The gas introduced into the receiving portion 65 flows parallel to the shutter 64 toward the exhaust port 76. The gas which cooled or purged the receiving portion 65 is exhausted through the exhaust port 76 and then flows through the duct 90f. The gas flowing vertically downward in the duct 90f changes its direction from vertically downward to horizontal at the connecting portion of the duct 90b. The gas flowing horizontally in the duct 90b then flows the path shared by the third circulation path 83 and the first circulation path 81 in vertical direction. That is, the gas cooled by the cooling unit 55 is ventilated by the fan 56a through the duct 90c, the buffer region 58a, the filter unit 59a into the upper region 60, and then supplied to the receiving portion 65 via the connecting port 94.

Effects According to the Second Embodiment

One or more advantageous effects described below are provided according to the second embodiment.

(a) The cleanliness in the transfer chamber 50 may be improved by cyclically supplying gas to the receiving portion 65 where heat or particles are likely to be accumulated.

(b) By locally exhausting the corner of the transfer chamber 50, the gas may be suppressed from being stagnant in the transfer chamber 50 and smoothly circulated.

(c) By deviating the exhaust port toward the driving unit of the shutter, the gas mainly flows into a region close to the driving unit of the shutter. As a result, the particles about the driving unit may be efficiently exhausted to improve the cleanliness in the transfer chamber 50.

(d) The gas flows along the curved portion provided at the intersection of two adjoining sides of the receiving portion 65, which prevents the stagnancy of the gas in the receiving portion 65. By providing the exhaust ports 76 on the curved portion and the side surface of the receiving portion 65 farther from the connecting port 94 rather than the side surface of the receiving portion 65 closer to the connecting port 94, the gas introduced into the receiving portion 65 is efficiently exhausted along the curved portion.

Figure 9:
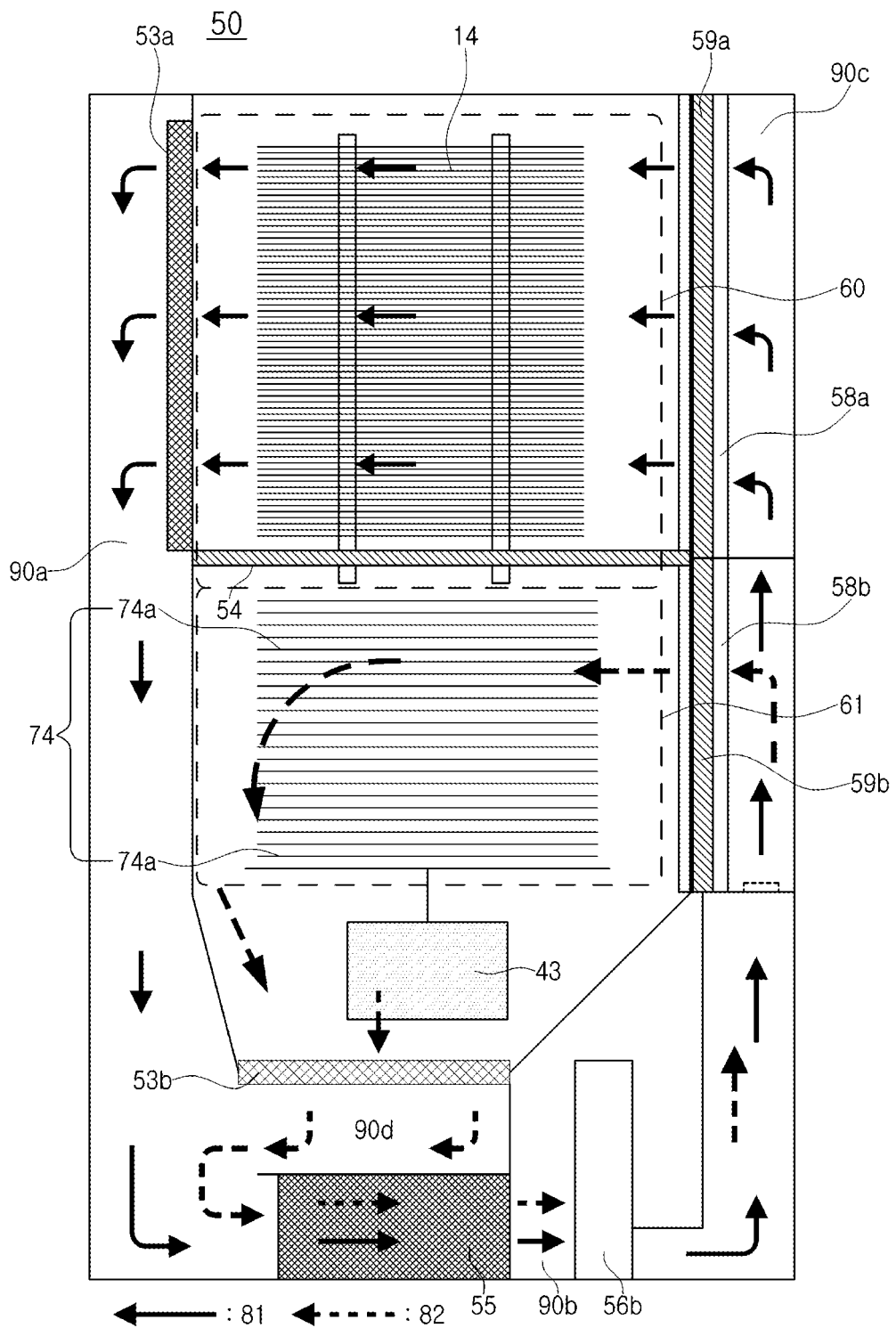
FIG. 9 is a diagram exemplifying a vertical cross-section of a transfer chamber of a substrate processing apparatus according to a third embodiment and a gas flow in the transfer chamber of the substrate processing apparatus according to the third embodiment.
Figure 10:
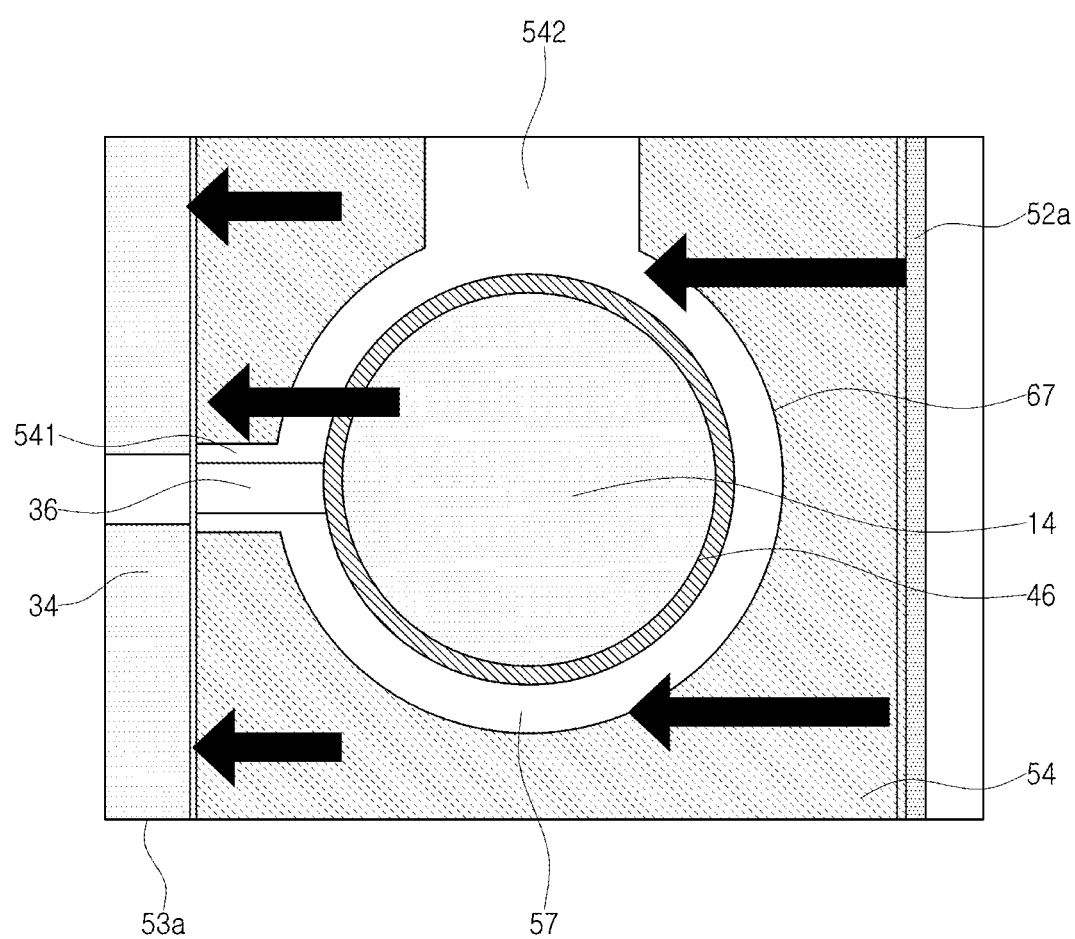
FIG. 10 is a diagram exemplifying a vertical cross-section of the transfer chamber of the substrate processing apparatus according to the third embodiment.

Next, a third embodiment will be described with reference to FIGS. 9 and 10.

The third embodiment differs from the first embodiment in that a boundary plate 54 is installed at the boundary between the upper region 60 and the lower region 61 in the transfer chamber 50. As shown in FIG. 9, the boundary plate 54 is disposed in the transfer chamber 50 to divide the inner space of the transfer chamber 50 vertically. Specifically, the boundary plate 54 is provided to partition the upper region 60 and the lower region 61 about the center portion of the transfer chamber 50. As shown in FIG. 10, the boundary plate 54 has an opening 57 at the center portion thereof wherein the diameter of the opening 57 is greater than that of the seal cap 46. A cutaway portion 541 having a width large enough to pass a boat arm 36 connecting the boat elevator and the seal cap 46 therethrough is provided at one side of the boundary plate 54 facing the boat elevator 34. A cutaway portion 542 having a width large enough to pass the base of the substrate transfer device 28 therethrough is provided at one side of the boundary plate 54 facing the substrate transfer device 28 such that the substrate transfer device 28 can access the boat 30 when transferring the substrate. That is, the boundary plate 54 has cutaway portions 541 and 542 at respective sides thereof so as not to interfere with the boat arm 36 and the substrate transfer device 28.

Effects According to the Third Embodiment

According to the third embodiment, the gas flow in the upper region 60 and the gas in the lower region 61 generated by the gas supply mechanisms 52a and 52b may be physically separated by installing the boundary plate 54 at the boundary between the upper region 60 and lower region 61 in the transfer chamber 50. As a result, advantageous effects further improved than the effect according to the first embodiment may be provided.

Other Embodiments

Next, other embodiments will be described.

While the transfer chamber employing one boat is exemplified in the above-described embodiments, the technique described herein is not limited thereto. The technique described herein may also be applied to two-boat apparatus capable of accommodating two boats 30 in process chamber 42 or unloading two boats 30 from process chamber 42.

Further, in addition to the above-described embodiments, the technique described may be embodied in various ways without departing from the gist of the present invention.

According to the technique described herein, the cooling time of the substrate may be shortened.

What is claimed is:

1. A substrate processing apparatus comprising:
   a substrate retainer configured to support a substrate;
   a heat-insulating unit disposed under the substrate retainer;
   a transfer chamber where the substrate is loaded into the substrate retainer;
   a process chamber in which the substrate supported by the substrate retainer is accommodated and processed;
   a seal cap configured to close a lower end of the process chamber;
   an elevating mechanism configured to move the seal cap;
   an arm connecting the seal cap to the elevating mechanism;
   a gas supply mechanism configured to supply a gas into the transfer chamber, the gas supply mechanism comprising: a first gas supply mechanism configured to supply the gas into an upper region of the transfer chamber, where the substrate retainer is disposed such that the gas flows horizontally through the upper region; and a second gas supply mechanism configured to supply the gas into a lower region of the transfer chamber, where the heat-insulating unit is provided such that the gas flows downward through the lower region; and
   a boundary plate disposed at a boundary between the upper region and the lower region in the transfer chamber to divide the transfer chamber into the upper region and the lower region,
   wherein the first gas supply mechanism and the second gas supply mechanism are disposed along a first sidewall of the transfer chamber, and the second gas supply mechanism is disposed lower than the first gas supply mechanism, wherein the boundary plate comprises an opening having a diameter greater than a diameter of the seal cap; a first cutaway portion wider than the arm to pass the arm therethrough; and a second cutaway portion wider than a substrate transfer device for transferring the substrate into the substrate retainer without colliding with the boundary plate.

2. The substrate processing apparatus of claim 1, further comprising a first exhaust unit disposed on a second sidewall opposite to the first sidewall with the substrate retainer disposed therebetween, wherein the first exhaust unit is configured to exhaust the gas supplied by the first gas supply mechanism.

3. The substrate processing apparatus of claim 2, further comprising a second exhaust unit disposed at a bottom of the transfer chamber, wherein the second exhaust unit is configured to exhaust the gas supplied by the second gas supply mechanism.

4. The substrate processing apparatus of claim 3, wherein the second exhaust unit is disposed closer to the second sidewall provided with the first exhaust unit than the first sidewall provided with the first gas supply mechanism in the transfer chamber.

5. The substrate processing apparatus of claim 3, wherein a horizontal cross-sectional area of the transfer chamber about the second exhaust unit is smaller than that of the transfer chamber about the lower region.

6. The substrate processing apparatus of claim 5, wherein at least one of a lower portion of the first sidewall provided with the first gas supply mechanism and a lower portion of the second sidewall provided with the first exhaust unit comprises a slope inclined inward toward a vertical center line of the transfer chamber.

7. The substrate processing apparatus of claim 6, wherein an upper end of the slope is lower than a lower end of the heat-insulating unit.

8. The substrate processing apparatus of claim 7, wherein the slope at the lower portion of the first sidewall is less inclined than the slope at the lower portion of the second sidewall.

9. The substrate processing apparatus of claim 3, further comprising:
a first circulation path configured to supply the gas exhausted from the upper region back into the upper region via the first gas supply mechanism; and
a second circulation path configured to supply the gas exhausted from the lower region back into the lower region via the second gas supply mechanism,
wherein the first circulation path and the second circulation path partially shares a confluent path having an upstream side where the first circulation path and the second circulation path converges and a downstream side where the confluent path is divided into the first circulation path and the second circulation path.

10. The substrate processing apparatus of claim 9, further comprising a cooling unit provided in the confluent path and configured to cool the gas.

11. The substrate processing apparatus of claim 10, wherein the first gas supply mechanism and the second gas supply mechanism comprise a first ventilation unit and a second ventilation unit configured to ventilate the gas, respectively, and provided at the downstream side of the confluent path adjacent to each other, the first ventilation unit having an output greater than an output of the second ventilation unit.

12. A substrate processing apparatus, comprising:
a substrate retainer configured to support a substrate;
a heat-insulating unit disposed under the substrate retainer;
a transfer chamber where the substrate is loaded into the substrate retainer;
a process chamber in which the substrate supported by the substrate retainer is accommodated and processed;
a shutter configured to close a lower end of the process chamber;
a receiving portion configured to accommodate the shutter when the substrate retainer is loaded into the process chamber, wherein the receiving portion is disposed at an upper end of one sidewall of the transfer chamber to protrude outward from the transfer chamber, the receiving portion having straight portions and a curved portion at an intersection of the straight portions;
a third exhaust unit configured to exhaust an inside of the receiving portion, wherein the third exhaust unit is disposed along the straight portions and the curved portion; and
a gas supply mechanism configured to supply a gas into the transfer chamber, the gas supply mechanism comprising: a first gas supply mechanism configured to supply the gas into an upper region of the transfer chamber, where the substrate retainer is disposed such that the gas flows horizontally through the upper region; and a second gas supply mechanism configured to supply the gas into a lower region of the transfer chamber, where the heat-insulating unit is provided such that the gas flows downward through the lower region,
wherein the first gas supply mechanism and the second gas supply mechanism are disposed along a first sidewall of the transfer chamber, and the second gas supply mechanism is disposed lower than the first gas supply mechanism.

13. The substrate processing apparatus of claim 12, wherein the third exhaust unit is further configured to exhaust a corner of the transfer chamber.

* * * * *